United States Patent
Endo

(10) Patent No.: US 6,344,881 B1
(45) Date of Patent: Feb. 5, 2002

(54) TELEVISION TUNER CAPABLE OF RECEIVING CATV BROADCASTING SIGNAL AND GROUND WAVE FM BROADCASTING SIGNAL

(75) Inventor: Masaaki Endo, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/385,675

(22) Filed: Aug. 27, 1999

(30) Foreign Application Priority Data

Aug. 27, 1998 (JP) ............................................ 10-242005

(51) Int. Cl.$^7$ ................................................ H04N 5/46
(52) U.S. Cl. ...................... 348/729; 348/731; 348/706
(58) Field of Search ................................ 348/729, 731, 348/706, 558, 725, 726; 455/180.1, 180.2, 188.1, 188.2, 190.1, 191.1, 337; 725/48

(56) References Cited

U.S. PATENT DOCUMENTS

| | | | |
|---|---|---|---|
| 5,010,400 A | * 4/1991 | Oto | ............................. 358/86 |
| 5,276,904 A | * 1/1994 | Mutzig et al. | ................ 455/3.2 |
| 5,393,713 A | * 2/1995 | Schwob | ................... 455/158.5 |
| 5,477,275 A | * 12/1995 | Toyoshima et al. | ......... 348/554 |
| 5,485,196 A | * 1/1996 | Nathan et al. | .................. 348/7 |
| 5,495,282 A | * 2/1996 | Mostafa | ......................... 348/5 |
| 5,584,051 A | * 12/1996 | Göken | .......................... 455/68 |

FOREIGN PATENT DOCUMENTS

| | | | |
|---|---|---|---|
| JP | A2 Hei 6-224797 | 8/1994 | |
| JP | A1 Hei 10-22856 | 1/1998 | |

* cited by examiner

*Primary Examiner*—Victor R. Kostak
(74) *Attorney, Agent, or Firm*—Brinks Hofer Gilson & Lione

(57) ABSTRACT

A television tuner comprises a tuner unit to which a cable and an FM broadcasting receiving antenna are connected, for frequency converting each of a television broadcasting signal, an FM broadcasting signal, and a ground wave FM broadcasting signal into an intermediate frequency signal and outputting the intermediate frequency signal, an intermediate frequency circuit unit for outputting an audio intermediate frequency signal and a video intermediate frequency signal, a demodulator, a pseudo carrier wave oscillator for outputting a pseudo carrier wave having the same frequency as that of the video intermediate frequency signal, switching means, and a switching control unit for supplying a switching voltage, wherein when the tuner unit receives the FM broadcasting signal or the ground wave FM broadcasting signal, the pseudo carrier wave is supplied to the demodulator.

5 Claims, 2 Drawing Sheets

TELEVISION TUNER CAPABLE OF RECEIVING CATV BROADCASTING SIGNAL AND GROUND WAVE FM BROADCASTING SIGNAL

BACKGROUND OF THE INVENTION

1. Field of the Invention

The present invention relates to a television tuner capable of receiving a CATV broadcasting signal in which a television broadcasting signal and an FM broadcasting signal are mixed and a ground wave FM broadcasting signal received via an FM broadcast receiving antenna (hereinbelow, simply called an FM antenna).

2. Description of the Related Art

A conventional television tuner will be described with reference to FIG. 3. In FIG. 3, a television tuner comprises a tuner unit 31 for receiving a CATV broadcasting signal and a ground wave FM broadcasting signal, an intermediate frequency circuit 32, a frequency converting circuit 33, a first demodulator 34 and a second demodulator 35.

An input change-over switch 36 is connected to the input terminal 31a of the tuner unit 31. A CATV cable 37 and an FM antenna 38 are connected to the input change-over switch 36. A CATV broadcasting signal led from the CATV cable 37 or a ground wave FM broadcasting signal received by the FM antenna 38 is received by the tuner unit 31. An output change-over switch 39 which operates interlockingly with the switching operation of the input change-over switch 36 is connected to the output terminal 31b of the tuner unit 31. To the output change-over switch 39, the intermediate frequency circuit (hereinbelow, called an IF circuit) 32 and the frequency converting circuit 33 are connected.

When the tuner unit 31 is connected to the CATV cable 37 by the input change-over switch 36, it is connected to the IF circuit 32. When the tuner unit 31 is connected to the FM antenna 38 by the input change-over switch 36, it is connected to the frequency converting circuit 33 by the output change-over switch 39.

The tuner unit 31 has a VHF circuit unit 31c and a UHF circuit unit 31d each comprising a tuning circuit, a mixing circuit, a local oscillating circuit, and the like (which are not shown). The tuner unit 31 frequency converts each of the CATV broadcasting signal and the ground wave FM broadcasting signal supplied to the input terminal 31a into an intermediate frequency signal (hereinbelow, referred to as an IF signal) and outputs the IF signal. Since the frequency of the ground wave FM broadcasting signal is close to the frequency of the low band of the VHF band in the CATV broadcasting signal, the ground wave FM broadcasting signal is received by the VHF circuit unit 31c.

At the occasion of receiving the broadcasting signal in the VHF band in the CATV broadcasting signal or the ground wave FM broadcasting signal, the received broadcasting signal in the VHF band or ground wave FM broadcasting signal is supplied to the VHF circuit unit 31c and is frequency converted into an IF signal. Similarly, at the occasion of receiving the UHF band broadcasting signal, the received UHF band broadcasting signal is supplied to the UHF circuit unit 31d and is frequency converted into an IF signal.

The IF signal of the CATV broadcasting signal outputted from the tuner unit 31 is supplied to the IF circuit 32. For example, the IF signal in a US channel includes an audio intermediate frequency signal (having a frequency of 41.25 MHz) S and a video intermediate frequency signal (having a frequency of 45.75 MHz) P and is supplied to the first demodulator 34. The IF signal is demodulated by the first demodulator 34 into an audio signal A and a video signal V. The audio and video signals A and V are thus obtained.

In case of receiving the ground wave FM broadcasting signal, the IF signal outputted from the VHF circuit unit 31c in the tuner unit 31 is supplied to the frequency converting circuit 33. The IF signal of the ground wave FM broadcasting signal has the same frequency as that of the audio IF signal S of the CATV broadcasting signal.

The IF signal outputted from the VHF circuit unit 31c is, generally, frequency converted by the frequency converting circuit 33 to generally used 10.7 MHz and the audio signal A is obtained by the second demodulator 35 as a general demodulator for FM radio which is connected to the next stage.

Such a CATV broadcasting signal includes not only a regular television broadcasting signal having what is called a video signal but also an FM broadcasting signal having only an audio signal and no video signal. Since a conventional television tuner, however, performs demodulation into the audio signal after obtaining a beat signal between the video IF signal P and the audio IF signal S, the FM broadcasting signal in the CATV broadcasting signal having no video IF signal P cannot be received.

SUMMARY OF THE INVENTION

The invention has been achieved to solve the problem and its object is to receive a television broadcasting signal and an FM broadcasting signal in a CATV broadcasting signal and a ground wave FM broadcasting signal which are led through a cable.

In order to solve the problem, a television tuner of the invention comprises: a tuner unit for receiving a CATV broadcasting signal in which a VHF band television broadcasting signal, a UHF band television broadcasting signal, and an FM broadcasting signal are mixed and a ground wave FM broadcasting signal, frequency converting each of the VHF band television broadcasting signal, the UHF band television broadcasting signal, the FM broadcasting signal, and the ground wave FM broadcasting signal into an intermediate frequency signal, and outputting the intermediate frequency signal; an intermediate frequency circuit for generating an audio intermediate frequency signal and a video intermediate frequency signal from the intermediate frequency signal; a demodulator for demodulating the audio intermediate frequency signal and the video intermediate frequency signal; and a pseudo carrier wave oscillator for outputting a pseudo carrier wave having the same frequency as that of the video intermediate frequency signal, wherein when the tuner unit receives the FM broadcasting signal in the CATV broadcasting signal or the ground wave FM broadcasting signal, the pseudo carrier wave is supplied to the demodulator. Accordingly, both of the FM broadcasting signal and the television broadcasting signal can be demodulated by the common demodulator.

According to a television tuner of the invention, the tuner unit comprises: an antenna switch circuit having a first input terminal to which the CATV broadcasting signal is supplied, a second input terminal to which the ground wave FM broadcasting signal is supplied, and an output terminal from which the supplied CATV broadcasting signal and the ground wave FM broadcasting signal are outputted, in which a first switching diode is provided between the first input terminal and the output terminal, and a second switching diode is provided between the second input terminal and the output terminal; a VHF circuit unit which is connected to the output terminal of the antenna switch circuit, to which the VHF band television broadcasting signal, the FM broadcasting signal, and the ground wave FM broadcasting signal are supplied, and from which an intermediate frequency signal is outputted; and a UHF circuit unit which is connected to the first input terminal, to which the UHF band television broadcasting signal is supplied, and from which an intermediate frequency signal is outputted through the output terminal, wherein when the VHF band television broadcasting signal or the FM broadcasting signal is received, the second switching diode is brought out of conduction and the first switching diode is brought into conduction, and when the ground wave FM broadcasting signal is received, the first switching diode is brought out of conduction, and the second switching diode is brought into conduction. Consequently, when the VHF circuit unit receives the VHF band television broadcasting signal or the FM broadcasting signal from the cable, the FM antenna is disconnected from the VHF circuit unit by the antenna switch circuit. When the VHF circuit unit receives the ground wave broadcasting signal or when the UHF circuit unit receives the UHF band television broadcasting signal, the VHF circuit unit is disconnected from the cable by the antenna switch circuit. It can be thus prevented that the VHF circuit unit and the UHF circuit do not interfere each other at the time of reception.

According to a television tuner of the invention, a third switching diode is provided between the first input terminal and the ground, a fourth switching diode is provided between the second input terminal and the ground, the third switching diode is brought out of conduction and the fourth switching diode is brought into conduction when the VHF band television broadcasting signal or the FM broadcasting signal is received, and the third switching diode is brought into conduction and the fourth switching diode is brought out of conduction when the UHF band television broadcasting signal or the ground wave FM broadcasting signal is received. Consequently, when the first and second switching diodes are not conducting, it can be prevented that the television broadcasting signal and the FM broadcasting signal are leaked from the first and second switching diodes and inputted to the VHF circuit unit.

A television tuner of the invention further comprises a switching control unit including: a switching voltage generator having a first output terminal from which a first switching voltage for switching the VHF circuit unit into a mode of receiving a low-band television broadcasting signal is outputted, a second output terminal from which a second switching voltage for switching the UHF circuit unit into an operating mode is outputted, and a third output terminal from which a third switching voltage for switching the VHF circuit unit into a mode of receiving a high-band television broadcasting signal is outputted; a transistor; and a resistor, wherein only the first switching voltage is generated and supplied to the VHF circuit unit and the first and fourth switching diodes are brought into conduction when the tuner unit receives the low-band television broadcasting signal in the VHF band television broadcasting signal or the FM broadcasting signal supplied from the first input terminal; only the second switching voltage is generated to apply a bias to the emitter of the transistor, and the second and third switching diodes are brought into conduction so as to supply the second switching voltage to the UHF circuit unit when the tuner unit receives the UHF band television broadcasting signal; only the third switching voltage is generated and applied to the VHF circuit unit and the first and fourth switching diodes are brought into conduction via the VHF circuit unit when the tuner unit receives the high-band television broadcasting signal in the VHF band television broadcasting signal; and both of the first and second switching voltages are generated, the first switching voltage is applied to the VHF circuit unit and the base of the transistor via the resistor, the second switching voltage is applied to the emitter of the transistor, and the second and third switching diodes are brought into conduction when the tuner unit receives the groundwave FM broadcasting signal Thus, by using the band switching voltage of the VHF circuit unit and the control voltage of the UHF circuit unit, the cable and the FM antenna connected to the antenna switch circuit can be switched.

According to a television tuner of the invention, switching means is provided between the demodulator and the pseudo carrier wave oscillator, the switching voltage generator is provided with a fourth output terminal for generating a fourth switching voltage for controlling the switching means when the tuner unit receives the FM broadcasting signal or the ground wave FM broadcasting signal, and the fourth switching voltage is applied to the switching means so that the pseudo carrier wave is supplied to the demodulator. Consequently, in association with the antenna switch circuit, the pseudo carrier wave outputted from the pseudo carrier wave oscillator can be supplied to the demodulator only when the FM broadcasting signal or the ground wave FM broadcasting signal is received.

DETAILED DESCRIPTION OF THE PREFERRED EMBODIMENT

Figure 1:
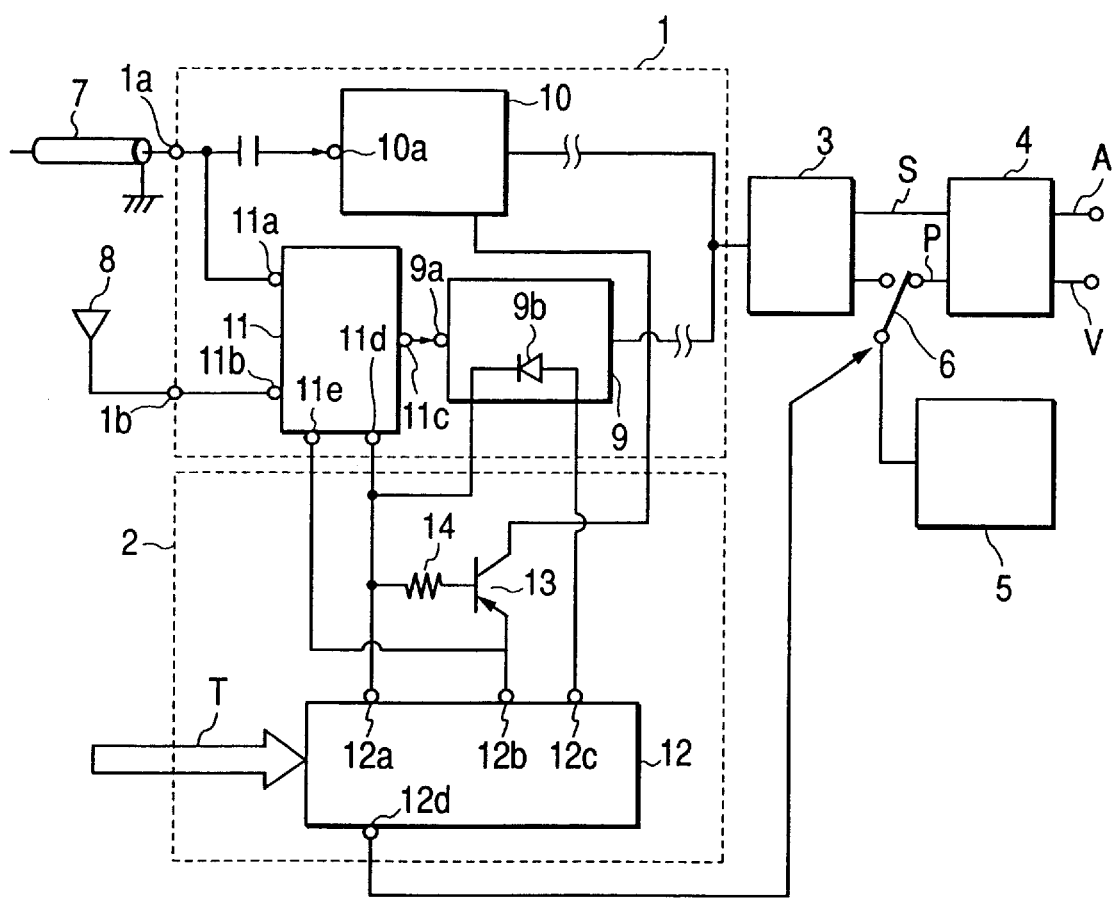
FIG. 1 is a block diagram of a television tuner of the invention.

A television tuner of the invention will be described with reference to FIG. 1. FIG. 1 is a block diagram of the television tuner of the invention which comprises a tuner unit 1, a switching control unit 2, an intermediate frequency circuit (hereinbelow, referred to as an IF circuit) 3, a demodulator 4, a pseudo carrier wave oscillator 5, and a switching means 6 for supplying a pseudo carrier wave from the pseudo carrier wave oscillator 5 to the demodulator 4. A cable 7 is connected to a first input terminal 1$a$ of the tuner unit 1 and a ground wave FM broadcast receiving antenna (hereinbelow, simply called an FM antenna) 8 is connected to a second input terminal 1$b$.

A CATV broadcasting signal led through the cable 7 is supplied to the first input terminal 1$a$ of the tuner unit 1 and a ground wave FM broadcasting signal received by the FM antenna 8 is supplied to the second input terminal 1$b$.

The CATV broadcasting signal led through the cable 7 includes what is called a regular television broadcasting signal having a video signal and an FM broadcasting signal having only an audio signal and no video signal. The FM broadcasting signal is broadcasted in the frequency band (a specific frequency band in the low band of the VHF band) different from that of the television broadcasting signal.

In the following description, the FM broadcasting signal led through the cable 7 is simply called an FM broadcasting signal and the FM broadcasting signal received by the FM antenna 8 is called a ground wave FM broadcasting signal.

In case of simply calling a television broadcasting signal, it denotes the CATV broadcasting signal having the video signal, which does not include the FM broadcasting signal.

The tuner unit 1 has a VHF circuit unit 9, an UHF circuit unit 10, and an antenna switch circuit 11. The cable 7 is connected to both an input terminal 10a of the UHF circuit unit 10 and a first input terminal 11a of the antenna switch circuit 11. The FM antenna 8 is connected to a second input terminal 11b of the antenna switch circuit 11. An output terminal 11c of the antenna switch circuit 11 is connected to an input terminal 9a of the VHF circuit unit 9.

The UHF band television broadcasting signal in the CATV broadcasting signal is supplied to the UHF circuit unit 10, and either the VHF band signal (the television broadcasting signal and the FM broadcasting signal) in the CATV broadcasting signal or the ground wave FM broadcasting signal is selected by the antenna switch circuit 11 and supplied to the VHF circuit unit 9.

Each of the VHF circuit unit 9 and the UHF circuit unit 10 has a tuning circuit, a mixing circuit, a local oscillation circuit, and the like (which are not shown), frequency converts the inputted television broadcasting signal, FM broadcasting signal, or ground wave FM broadcasting signal to an intermediate frequency signal (hereinbelow, referred to as an IF signal), and outputs the IF signal. The VHF circuit unit 9 can be switched between two bands (low band and high band).

When the television broadcasting signal is received, in a US channel for example, the IF signal outputted from the tuner unit 1 includes an audio IF signal (having a frequency of 41.25 MHz) S and a video IF signal (having a frequency of 45.75 MHz). When the FM broadcasting signal and the ground wave FM broadcasting signal are received, each of the signals includes only the audio IF signal (having a frequency of 41.25 MHz) S.

The IF signal outputted from the tuner unit 1 is supplied to the IF circuit unit 3 connected to the output terminal of the tuner unit 1.

The antenna switch circuit 11 has a first switching voltage input terminal 11d and a second switching voltage input terminal 11e. A first switching voltage outputted from the switching control unit 2 is supplied to the first switching voltage input terminal 11d and a second switching voltage outputted from the switching control unit 2 is supplied to the second switching voltage input terminal 11e.

The switching control unit 2 comprises a switching voltage generator 12, a PNP type transistor 13, and a resistor 14.

The switching voltage generator 12 has first to fourth output terminals 12a to 12d from one of which the switching voltage is outputted according to the receiving band on the basis of a channel selection signal T.

The first output terminal 12a is connected to both the first switching voltage input terminal 11d of the antenna switch circuit 11 and the cathode of a switching diode 9b for band switching provided in the VHF circuit unit 9. The second output terminal 12b is connected to both the second switching voltage input terminal 11e of the antenna switch circuit 11 and the emitter of the transistor 13. The third output terminal 12c is connected to the anode of the switching diode 9b for band switching provided in the VHF circuit unit 9.

The base of the transistor 13 is connected to the first output terminal 12a via the resistor 14 and the collector is connected to the UHF circuit unit 10. Further, the fourth output terminal 12d is connected to the switching means 6.

At the occasion of receiving the UHF band television broadcasting signal, only the second switching voltage is outputted from the second output terminal 12b. At the occasion of receiving the television broadcasting signal in the high band of the VHF band, only the third switching voltage is outputted from the third output terminal 12c. At the occasion of receiving the television broadcasting signal in the low band of the VHF band, only the first switching voltage is outputted from the first output terminal 12a.

At the occasion of receiving the FM broadcasting signal in the CATV broadcasting signal, the first and fourth switching voltages are outputted from the first and fourth output terminals 12a and 12d, respectively. At the occasion of receiving the ground wave FM broadcasting signal, the first, second, and fourth switching voltages are outputted from the first, second, and fourth output terminals 12a, 12b, and 12d, respectively.

Figure 2:
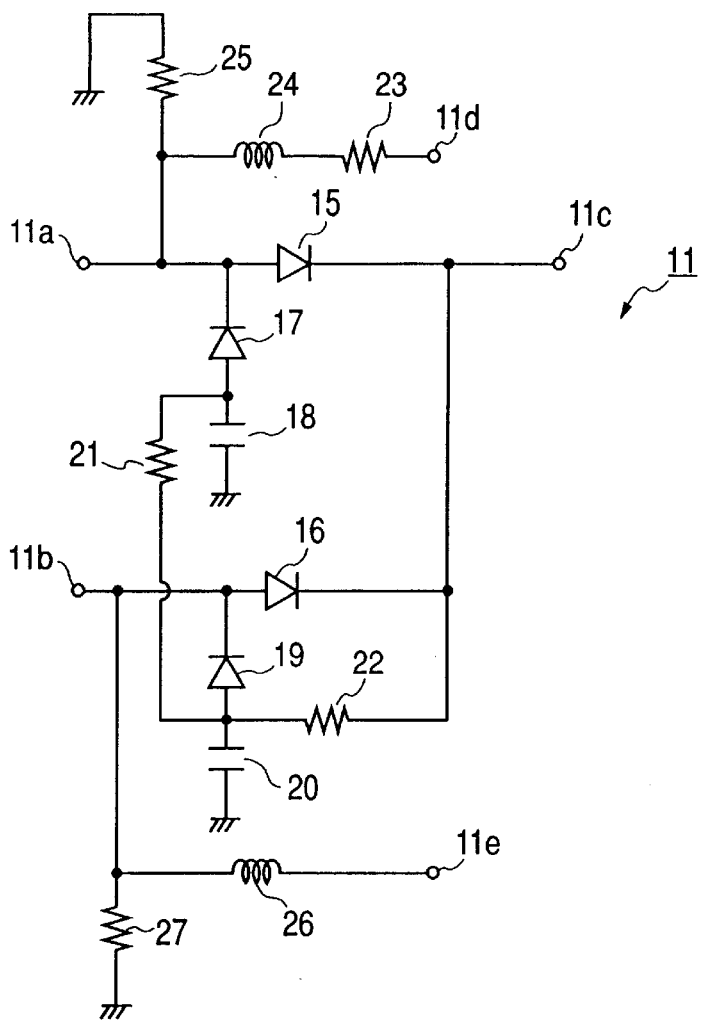
FIG. 2 is a circuit diagram of an antenna switch circuit of the television tuner of the invention.
Figure 3:
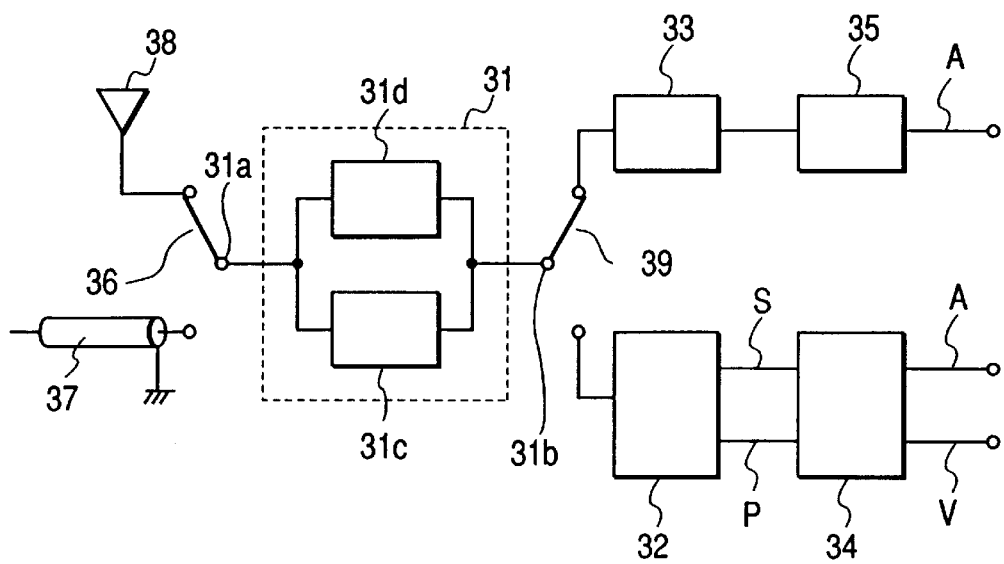
FIG. 3 is a block diagram of a conventional television tuner.

The antenna switch circuit 11 will now be specifically described with reference to FIG. 2. In FIG. 2, the antenna switch circuit 11 has the first input terminal 11a, the second input terminal 11b, the output terminal 11c, the first switching voltage input terminal 11d, and the second switching voltage input terminal 11e.

The first input terminal 11a and the output terminal 11c are connected to each other via a first switching diode 15. In this case, the anode of the first switching diode 15 is connected to the first input terminal 11a. The second input terminal 11b and the output terminal 11c are connected to each other via a second switching diode 16. Similarly, the anode of the second switching diode 16 is connected to the second input terminal 11b.

Between the anode of the first switching diode 15 and the ground, a third switching diode 17 and a DC blocking capacitor 18 which are connected in series are provided. One end of the DC blocking capacitor 18 is grounded and the cathode of the third switching diode 17 is connected to the anode of the first switching diode 15.

Similarly, between the anode of the second switching diode 16 and the ground, a fourth switching diode 19 and a DC blocking capacitor 20 which are connected in series are provided. One end of the DC blocking capacitor 20 is grounded and the cathode of the fourth switching diode 19 is connected to the anode of the second switching diode 16.

A connection point between the third switching diode 17 and the DC blocking capacitor 18 and a connection point between the fourth switching diode 19 and the DC blocking capacitor 20 are connected to each other via a resistor 21. Further, the connection point between the fourth switching diode 19 and the DC blocking capacitor 20 and the output terminal 11c are connected to each other via a resistor 22.

The first switching voltage input terminal 11d is connected to the anode of the first switching diode 15 via a resistor 23 and a coil 24 which are connected in series. A connection point between the coil 24 and the first switching diode 15 is grounded via a resistor 25.

The second switching voltage input terminal 11e is connected to the anode of the second switching diode 16 via a coil 26. A connection point between the second switching diode 16 and the coil 26 is grounded via a resistor 27.

The first and second switching voltages are equal.

In such a construction, first, at the occasion of receiving the UHF band television broadcasting signal through the cable 7, the second switching voltage is generated at the second output terminal 12b of the switching voltage generator 12. The second switching voltage is supplied to both the second switching voltage input terminal 11e of the antenna switch circuit 11 and the emitter of the transistor 13.

At this time, in the antenna switch circuit 11, a voltage is supplied to both the anode of the second switching diode 16 and the cathode of the fourth switching diode 19 and a current is passed through the second switching diode 16, resistors 22 and 21, third switching diode 17 and resistor 25, thereby bringing the second and third switch diodes 16 and 17 into conduction.

The FM antenna 8 is therefore connected via the second switching diode 16 to the VHF circuit 9 and the cable 7 is grounded via the third switching diode 17 in a high frequency manner.

Since the voltage is applied to the anode of the fourth switching diode 19 via the resistor 22, the voltage applied to the anode is lower than a voltage applied to the cathode. The fourth switching diode 19 is therefore brought out of conduction.

Since the voltage applied to the anode of the first switching diode 15 is lower than the voltage applied to the cathode by an amount reduced by the resistors 22 and 21, the first switching diode 15 is brought out of conduction. The cable 7 is therefore disconnected from the VHF circuit unit 9 by the first switching diode 15.

The voltage applied to the anode of the first switching diode 15 appears at the first switching voltage input terminal 11d. Since the voltage is dropped as compared with the second switching voltage applied to the emitter of the transistor 13, a current is passed to the base of the transistor 13. The emitter and collector of the transistor 13 are therefore made conductive and the second switching voltage is applied to the UHF circuit unit 10 from the collector of the transistor 13.

As a result, the UHF circuit unit 10 is made operative.

In such a state, the UHF band television broadcasting signal supplied via the cable 7 is inputted only to the UHF circuit unit 10. The UHF band television broadcasting signal supplied to the UHF circuit unit 10 is converted into an IF signal by a tuning circuit, a mixing circuit, a local oscillation circuit, and the like (which are not shown) and the IF signal is outputted.

At the occasion of receiving the high-band television broadcasting signal in the VHF band television broadcasting signal, the third switching voltage is generated at the third output terminal 12c of the switching voltage generator 12. The third switching voltage is applied to the anode of the switching diode 9b provided in the VHF circuit unit 9.

The switching diode 9b is brought into conduction and the third switching voltage is supplied from the cathode of the switching diode 9b to the first switching voltage input terminal 11d of the antenna switch circuit 11. The VHF circuit unit 9 is therefore switched into a mode of receiving the high-band television broadcasting signal.

In the antenna switch circuit 11, a current is passed through the first switching diode 15, resistor 22, fourth switching diode 19, and resistor 27, thereby bring the first and fourth switching diodes 15 and 19 into conduction.

The cable 7 is therefore connected to the VHF circuit unit 9 via the first switching diode 15 and the FM antenna 8 is grounded via the fourth switching diode 19 in a high frequency manner.

The voltage applied to the anode of the second switching diode 16 is dropped as compared with the voltage applied to the cathode only by an amount reduced by the resistor 22.

Since the second switching diode 16 is therefore brought bout of conduction, the FM antenna 8 is disconnected from the VHF circuit unit 9.

The voltage at the anode of the fourth switching diode 19 is applied to the third switching diode 17 via the resistor 21. The voltage applied to the anode of the third switching diode 17 is lower than that applied to the cathode since it is dropped by the resistors 21 and 22. The third switching diode 17 is accordingly brought out of conduction.

As a result, the VHF circuit unit 9 is connected to the cable 7 via the first switching diode 15. The high-band television broadcasting signal supplied to the VHF circuit unit 9 is converted into an IF signal by a tuning circuit, a mixing circuit, a local oscillating circuit, and the like (which are not shown), and the IF signal is outputted.

Since the second switching voltage is not generated from the second output terminal 12b, no voltage is applied to the UHF circuit 10.

At the occasion of receiving the low-band television broadcasting signal in the VHF band television broadcasting signal, the first switching voltage is generated at the first output terminal 12a of the switching voltage generator 12. The first switching voltage is applied to both the first switching voltage input terminal 11d of the antenna switch circuit 11 and the cathode of the switching diode 9b provided in the VHF circuit unit 9, and the switching diode 9b is brought out of conduction, thereby switching the VHF circuit unit 9 into the mode of receiving the low-band television broadcasting signal.

In the antenna switch circuit 11, in a manner similar to the case of receiving the high-band television broadcasting signal, the first and fourth switching diodes 15 and 19 are brought into conduction and the second and third switching diodes 16 and 17 are brought out of conduction, so that the VHF circuit unit 9 is connected to the cable 7 via the first switching diode 15. The FM antenna 8 is grounded via the fourth switching diode 19 in a high frequency manner and disconnected from the VHF circuit unit 9 by the second switching diode 16.

The low-band television broadcasting signal supplied from the cable 7 to the VHF circuit unit 9 is converted into an IF signal by a tuning circuit, a mixing circuit, a local oscillation circuit, and the like (which are not shown), and the IF signal is outputted.

Since the second switching voltage is not generated at the second output terminal 12b, no voltage is applied to the UHF circuit unit 10 and the UHF circuit unit 10 does not operate.

At the occasion of receiving the FM broadcasting signal from the cable 7, it is necessary to set the antenna switch circuit 11 into the same mode as that of receiving the low-band television broadcasting signal in the VHF band. The first switching voltage is generated from the first output terminal 12a of the switching voltage generator 12. The fourth switching voltage is also generated at the fourth output terminal 12d, which will be described hereinlater.

In a manner similar to the case of receiving the low-band television broadcasting signal in the VHF band, the first and fourth switching diodes 15 and 19 are brought into conduction and the second and third switching diodes 16 and 17 are brought out of conduction. The VHF circuit unit 9 is therefore connected to the cable 7 via the first switching diode 15. The FM antenna 8 is grounded via the fourth switching diode 19 in a high frequency manner and is disconnected from the VHF circuit unit 9. The VHF circuit unit 9 is switched to the mode of receiving the low-band television broadcasting signal.

The FM broadcasting signal supplied to the VHF circuit unit 9 is converted into an IF signal by a tuning circuit, a mixing circuit, a local oscillating circuit, and the like and the IF signal is outputted.

Since a second switching voltage is not generated at the second output terminal 12b, no voltage is applied to the UHF circuit unit 10.

In case of receiving the ground wave FM broadcasting signal from the FM antenna 8, the first switching voltage is generated at the first output terminal 12a of the switching voltage generator 12 and the second switching voltage is generated at the second output terminal 12b. At this time, the fourth switching voltage is generated at the fourth output terminal 12d, which will be described hereinlater.

The first switching voltage is applied to both the first switching voltage input terminal 11d of the antenna switch circuit 11 and the cathode of the switching diode 9b in the VHF circuit unit 9 and the second switching voltage is applied to both the second switching voltage input terminal 11e and the emitter of the transistor 13. The VHF circuit unit 9 is switched into the mode of receiving the low-band television broadcasting signal.

A voltage stepped down by the resistors 23 and 25 is applied to both the anode of the first switching diode 15 and the cathode of the third switching diode 17. By passing a current through the second switching diode 16, resistors 22 and 21, third switching diode 17, and resistor 25, the second and third switching diodes 16 and 17 are brought into conduction.

The FM antenna 8 is connected to the VHF circuit unit 9 via the second switching diode 16 and the cable 7 is grounded via the second switching diode 17 in a high frequency manner.

A voltage is applied via the resistor 22 to the anode of the fourth switching diode 19. Since the voltage is supplied via the resistor 22, the voltage applied to the anode is lower than the voltage applied to the cathode. Consequently, the fourth switching diode 19 is brought out of conduction.

The cable 7 is therefore grounded via the third switching diode 17 and disconnected from the VHF circuit unit 9. The FM antenna 8 is connected to the VHF circuit unit 9 via the second switching diode 16. The FM broadcasting signal supplied to the VHF circuit unit 9 is converted into an IF signal by a tuning circuit, a mixing circuit, a local oscillating circuit, and the like (which are not shown) and the IF signal is outputted.

Although the first switching voltage is applied to the base of the transistor 13 and the second switching voltage is applied to the emitter, since the first and second switching voltages are equal, no potential difference occurs between the emitter and the base of the transistor 13. The emitter and the collector are made nonconductive and the second switching voltage is not applied to the UHF circuit unit 10.

At the occasion of receiving the FM broadcasting signal or the ground wave FM broadcasting signal, the fourth switching voltage is generated also at the fourth output terminal 12d of the switching voltage generator 12. The fourth switching voltage is applied to the switching means 6.

In summary, at the occasion of receiving the UHF band television broadcasting signal and the VHF high-band and low-band television broadcasting signals, the video IF signal and the audio IF signal are supplied to the IF circuit 3. At the occasion of receiving the FM broadcasting signal and the ground wave FM broadcasting signal, only the audio IF signal is supplied to the IF circuit 3.

The IF signal outputted from the IF circuit 3 is supplied to the demodulator 4.

The demodulator 4 demodulates the supplied audio IF signal S and the video IF signal P and outputs the audio signal A and the video signal V. In case of demodulating the audio IF signal S, the demodulator 4 demodulates it after generating a beat signal between the video IF signal P and the audio IF signal S. Consequently, at the occasion of demodulating the FM broadcasting signal and the ground wave FM broadcasting signal, since no video IF signal exists, the signals cannot be demodulated.

At the occasion of receiving the FM broadcasting signal or the ground wave FM broadcasting signal, the pseudo carrier wave oscillator 5 is connected to the demodulator 4 via the switching means 6 connected to the input terminal of the demodulator 4. In place of the video IF signal P, the pseudo carrier wave (having the frequency of 45.75 MHz) which is the same as that of the video IF signal outputted from the pseudo carrier wave oscillator is supplied to the demodulator 4.

The beat signal between the pseudo carrier wave and the audio IF signal is generated, the audio IF signal S of the FM broadcasting signal or the ground wave FM broadcasting signal is demodulated, and the audio signal A is outputted.

What is claimed is:

1. A television tuner comprising:
a tuner unit for receiving a CATV broadcasting signal in which a VHF band television broadcasting signal, a UHF band television broadcasting signal, and an FM broadcasting signal are mixed and a ground wave FM broadcasting signal, frequency converting each of the VHF band television broadcasting signal, the UHF band television broadcasting signal, the FM broadcasting signal, and the ground wave FM broadcasting signal into an intermediate frequency signal, and outputting the intermediate frequency signal; an intermediate frequency circuit for generating an audio intermediate frequency signal and a video intermediate frequency signal from the intermediate frequency signal; a demodulator for demodulating the audio intermediate frequency signal and the video intermediate frequency signal; and a pseudo carrier wave oscillator for outputting a pseudo carrier wave having the same frequency as that of the video intermediate frequency signal, wherein when the tuner unit receives the FM broadcasting signal in the CATV broadcasting signal or the ground wave FM broadcasting signal, the pseudo carrier wave is supplied to the demodulator.

2. A television tuner according to claim 1, wherein the tuner unit comprises: an antenna switch circuit having a first input terminal to which the CATV broadcasting signal is supplied, a second input terminal to which the ground wave FM broadcasting signal is supplied, and an output terminal from which the supplied CATV broadcasting signal and the ground wave FM broadcasting signal are outputted, in which a first switching diode is provided between the first input terminal and the output terminal, and a second switching diode is provided between the second input terminal and the output terminal; a VHF circuit unit which is connected to the output terminal of the antenna switch circuit, to which the VHF band television broadcasting signal, the FM broadcasting signal, and the ground wave FM broadcasting signal are supplied, and from which an intermediate frequency signal is outputted; and a UHF circuit unit which is connected to the first input terminal, to which the UHF band television broadcasting signal is supplied, and from which an intermediate frequency signal is outputted through the output terminal, wherein when the VHF band television broadcasting signal or the FM broadcasting signal is received, the second switching diode is brought out of conduction and the first switching diode is brought into conduction, and when the ground wave FM broadcasting signal is received, the first switching diode is brought out of conduction, and the second switching diode is brought into conduction.

3. A television tuner according to claim 2, wherein a third switching diode is provided between the first input terminal and the ground, a fourth switching diode is provided between the second input terminal and the ground, the third switching diode is brought out of conduction and the fourth switching diode is brought into conduction when the VHF band television broadcasting signal or the FM broadcasting signal is received, and the third switching diode is brought into conduction and the fourth switching diode is brought out of conduction when the UHF band television broadcasting signal or the ground wave FM broadcasting signal is received.

4. A television tuner according to claim 3, further comprising a switching control unit including: a switching voltage generator having a first output terminal from which a first switching voltage for switching the VHF circuit unit into a mode of receiving a low-band television broadcasting signal is outputted, a second output terminal from which a second switching voltage for switching the UHF circuit unit into an operating mode is outputted, and a third output terminal from which a third switching voltage for switching the VHF circuit unit into a mode of receiving a high-band television broadcasting signal is outputted; a transistor; and a resistor, wherein only the first switching voltage is generated and supplied to the VHF circuit unit and the first and fourth switching diodes are brought into conduction when the tuner unit receives the low-band television broadcasting signal in the VHF band television broadcasting signal or the FM broadcasting signal supplied from the first input terminal; only the second switching voltage is generated to apply a bias to the emitter of the transistor, and the second and third switching diodes are brought into conduction so as to supply the second switching voltage to the UHF circuit unit when the tuner unit receives the UHF band television broadcasting signal; only the third switching voltage is generated and applied to the VHF circuit unit and the first and fourth switching diodes are brought into conduction via the VHF circuit unit when the tuner unit receives the high-band television broadcasting signal in the VHF band television broadcasting signal; and both of the first and second switching voltages are generated, the first switching voltage is applied to the VHF circuit unit and the base of the transistor via the resistor, the second switching voltage is applied to the emitter of the transistor, and the second and third switching diodes are brought into conduction when the tuner unit receives the ground wave FM broadcasting signal.

5. A television tuner according to 4, wherein switching means is provided between the demodulator and the pseudo carrier wave oscillator, the switching voltage generator is provided with a fourth output terminal for generating a fourth switching voltage for controlling the switching means when the tuner unit receives the FM broadcasting signal or the ground wave FM broadcasting signal, and the fourth switching voltage is applied to the switching means so that the pseudo carrier wave is supplied to the demodulator.

* * * * *